(12) United States Patent
Tan

(10) Patent No.: US 6,361,345 B1
(45) Date of Patent: Mar. 26, 2002

(54) ELECTRICAL CONNECTOR

(76) Inventor: Ying Wu Tan, 3Fl., No.492-19, Sec.1 Wan-Shou Rd., Tao-Yuan Hsien (TW)

( * ) Notice: Subject to any disclaimer, the term of this patent is extended or adjusted under 35 U.S.C. 154(b) by 0 days.

(21) Appl. No.: 09/565,407

(22) Filed: May 4, 2000

(51) Int. Cl.⁷ .......................................... H01R 13/625
(52) U.S. Cl. .................................................... 439/342
(58) Field of Search .......................... 439/342, 259–270

(56) References Cited

U.S. PATENT DOCUMENTS

| | | | | |
|---|---|---|---|---|
| 5,529,511 A | * | 6/1996 | Matsuoka | 439/342 |
| 5,578,870 A | * | 11/1996 | Farnsworth et al. | 439/342 |
| 5,679,020 A | * | 10/1997 | Lai et al. | 439/342 |
| 5,947,778 A | * | 9/1999 | Lai et al. | 439/342 |

* cited by examiner

*Primary Examiner*—Gary Paumen

(57) ABSTRACT

An electrical connector for connecting a chip module with pins to mainboard of computer is provided. The connector comprises a connector body, a plurality of inverted L-shaped pins, a sliding board, and a lock lever wherein two tabs are provided on two opposing sides of sliding board adjacent to lock lever such that tabs may bend to press chip module mounted on sliding board when pulling down lock lever to urge against tabs for securing chip module on sliding board. Pins of connector are overlapped in pin holes through connector body such that elongated flexible portion of one pin may extend to adjacent pin when rods of pins are secured in pin holes. This can provide a good electrical contact between engagement portions of pins of connector and pins of secured chip module due to the sufficient elastic force of flexible portion of pin.

8 Claims, 6 Drawing Sheets

ELECTRICAL CONNECTOR

FIELD OF THE INVENTION

The present invention relates to electrical connectors, and more particularly to an electrical connector for connecting a central processing unit (CPU) to a mainboard of a computer.

BACKGROUND OF THE INVENTION

With developments of electronic technology, a single electronic device can provide many different features. As a result, precision and stability become important features for enhancing functions of an electronic device. Therefore, quality control must be strictly performed in the manufacturing process. For example, the number of the input/output (I/O) pins of a chip module (e.g., CPU) are increased, while the size of each pin is reduced. Therefore, it is important to position a CPU firmly on the seat of a mainboard so as to enhance data transmission quality.

A conventional electrical connector for connecting a CPU with the mainboard of a computer is shown in FIG. 1. The electrical connector comprises a squared connector body 7 with a squared central opening and a plurality of pins 8. The connector body 7 has a support surface 70 on the top thereof for holding a sliding board 73 with a mounted chip module (not shown), an engagement surface 71 on the bottom for being engaged to a mainboard (not shown), a plurality of pin holes 72 penetrating through the corners of the connector body 7 for receiving the pins 8, and a lock lever 74 provided on one side of the support surface 70 for engaging the support surface 70 with the sliding board 73 so as to pivotably rotate the sliding board 73 with respect to the support surface 70 within a predetermined range of angles. With above arrangement, the pins of the chip module may be tightly engaged with engagement portions 83 of the pins 8, resulting in an electrical connection between the chip module and the mainboard. However, the previous design has several disadvantages: 1) The chip module mounted on the sliding board 73 may become loose when the lock lever 74 is pulled down to secure the sliding board 73 to the support surface 70 without using any additional fastening mechanism. As a result, a poor electrical connection between the chip module and the mainboard is formed. 2) The fastening portion 81 of the pin 8 is secured to the wall of the pin hole 72, while a rod 80 is engaged to the mainboard. Further, the engagement portion 83 is well engaged with the chip module by a force applied by the flexible portion 82, but the flexible portion 82 only has a short length, resulting in an insufficient elastic force. This may have a poor contact between the engagement portions 83 and the pins of the chip module.

SUMMARY OF THE INVENTION

Therefore, an object of the present invention is to provide an electrical connector for securing a chip module on a mainboard of a computer.

Another object of the present invention to provide an electrical connector having a plurality of pins with a preferred elasticity for providing high quality data transmission ability between the mainboard and the chip module.

In one aspect of the present invention, there is provided an electrical connector comprising a connector body, a plurality of pins, a sliding board, and a lock lever wherein two tabs are provided on two opposing sides of the sliding board adjacent to a lock lever such that tabs may be bent to press the chip module mounted on the sliding board when the lock lever is pulled down to resist against the tabs. With this arrangement, the chip module is secured to the sliding board by the tabs.

In another aspect of the present invention, there is provided an electrical connector having a plurality of pins with an inverted L-shape. Further, the plurality of pins are overlapped in the pin holes such that the flexible portion of one pin may extend to adjacent pin when the rods of the pins are secured in the pin holes. It is provided that flexible portion has a relatively longer length as compared to a conventional one, resulting in a sufficient elastic force. As a result, a good contact between the engagement portions of the pins of the connector and the pins of the chip module is obtained, thereby enabling a high quality data transmission between the mainboard and the chip module.

The above and other objects, features and advantages of the present invention will become apparent from the following detailed description taken with the accompanying drawings.

DETAILED DESCRIPTION OF THE PREFERRED EMBODIMENTS

Figure 1:
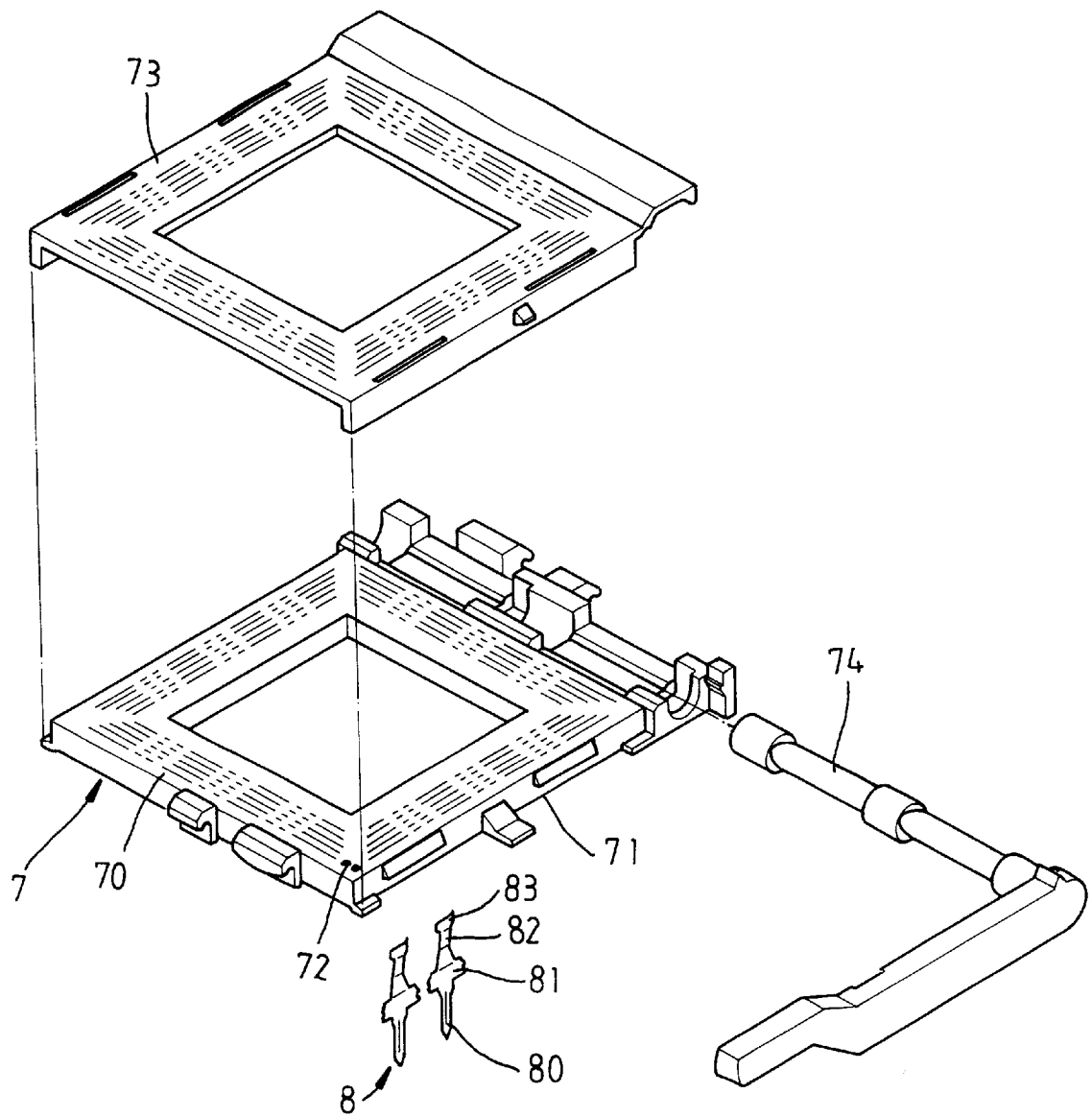
FIG. 1 is an exploded view of a conventional electrical connector.
Figure 2:
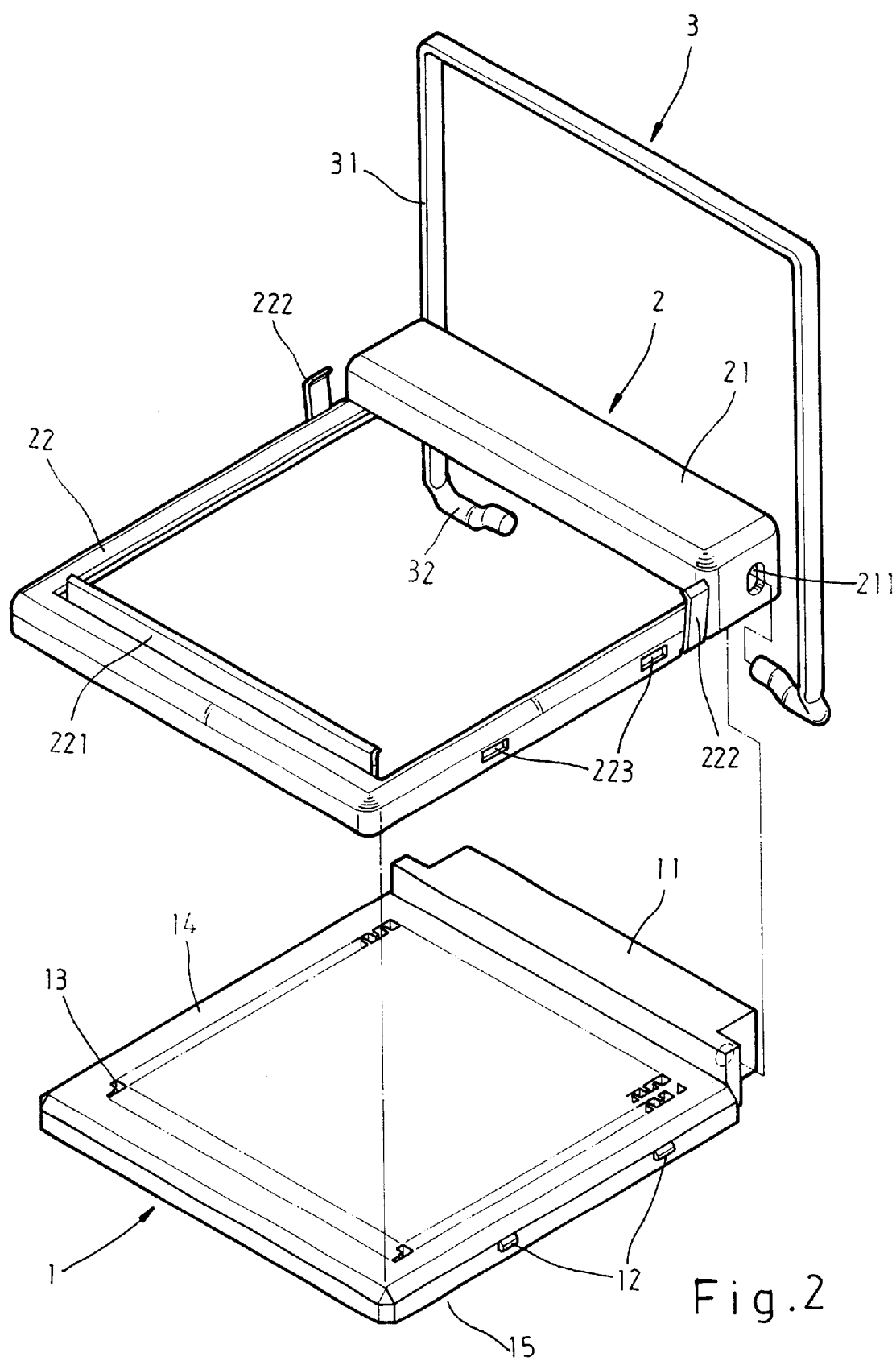
FIG. 2 is an exploded view of a preferred embodiment of the electrical connector according to the invention.
Figure 3:
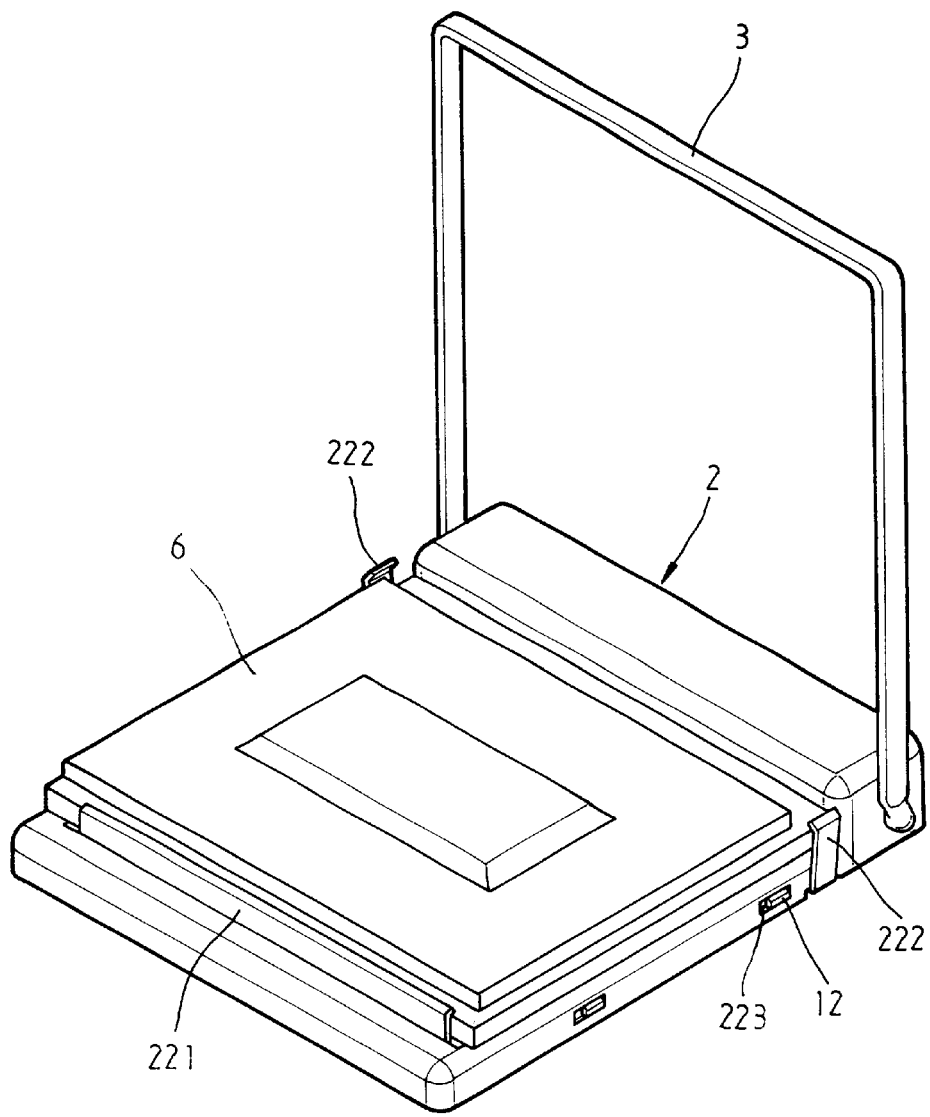
FIG. 3 is a perspective view of an assembled connector shown in FIG. 2 with a chip module mounted thereon.

Referring to the accompanying drawings particularly to FIGS. 2 and 3, there is shown an electrical connector constructed in accordance with the invention. The electric connector comprises a connector body 1, a plurality of pins 4, a sliding board 2, and a lock lever 3.

The connector body 1 has a support surface 14 on a top thereof for holding the sliding board 2 with a chip module 6 mounted thereon, an engagement surface 15 on a bottom thereof for being engaged with a mainboard (not shown), a plurality of pin holes 13 in the corners of the connector body 1, and a base 11 disposed on one side of the connector body 1.

The sliding board 2 has a frame 22 for being engaged with the support surface 14 of the connector body 1 and a pivot portion 21 abutted to a side of the frame 22 corresponding to the base 11 of the connector body 1. The sliding board 2 can move horizontally with respect to connector body 1 in a predetermined short distance.

The lock lever 3 is an n-shaped member having two opposed posts 31. Each post 31 has a portion 32 bent toward the other post 31. Therefore, as the bent portions 32 insert into the pivot portion 211 and thus into the base 11 for securing the lock lever 3, sliding board 2, and connector body 1 together such that the above horizontal movement of sliding board 2 with respect to connector body 1 may be effected by pulling down the lock lever 3 in place as will be described in detail hereinafter. Further, a latching member 221 is provided on a side of frame 22 opposed to the pivot portion 21 and two flexible tabs 222 are protruded upward on two opposing sides of the frame 22 adjacent to the lock lever 3. Moreover, two spaced openings 223 are provided on the same side of the tab 222. Correspondingly, two projections 12 slightly smaller than the openings 223 are provided on the connector body 1 for being inserted into the openings 223. As a result, the sliding board 2 may be secured to the connector body 1, while being allowed to move horizontally through a small predetermined distance with respect to connector body 1.

Figure 4A:
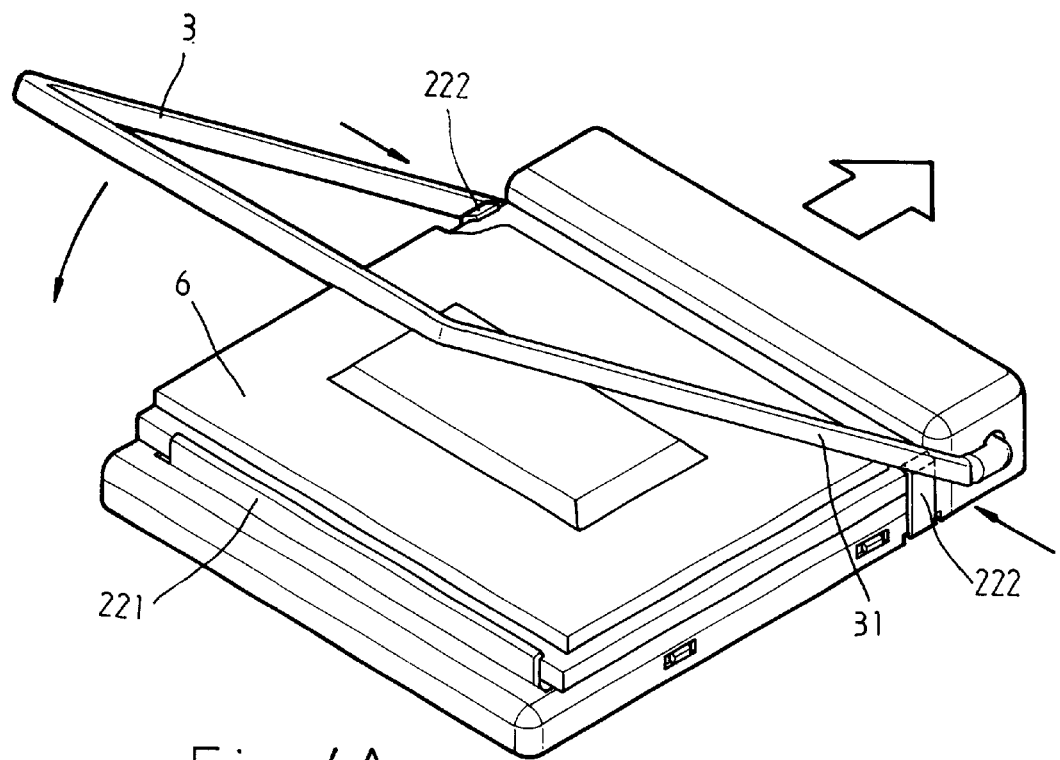
FIG. 4A is similar to FIG. 3 shown an operation of securing the chip module is illustrated.
Figure 4B:
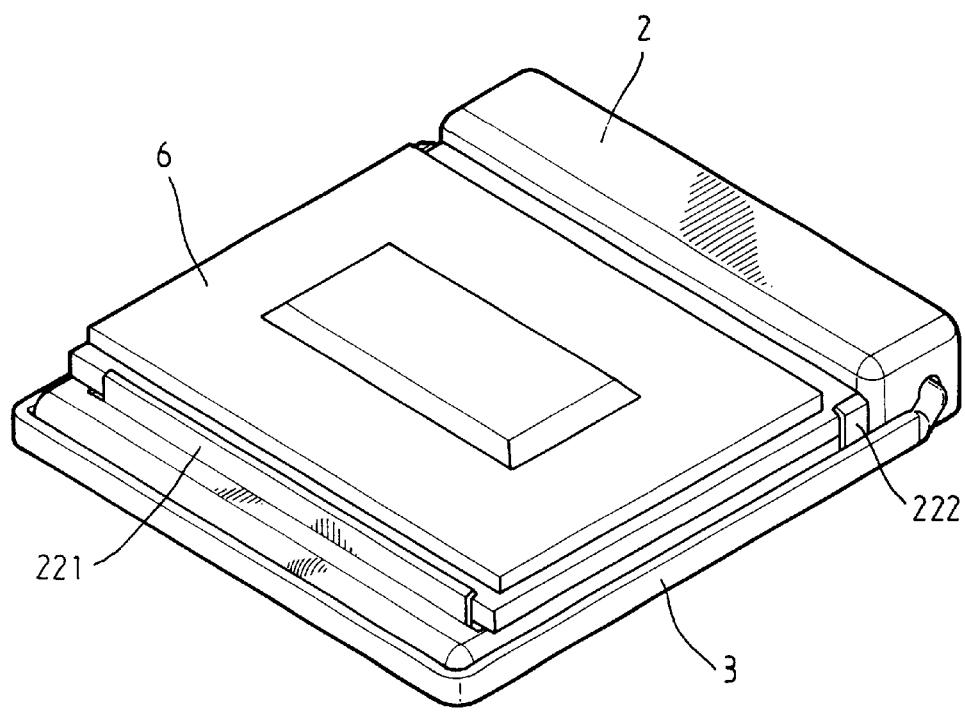
FIG. 4B is similar to FIG. 4B, wherein the chip module has secured to the connector.

Referring to FIGS. 4A and 4B, tabs 222 may be bent to press the chip module 6 mounted on the frame 22 when the lock lever 3 is pulled down so as to force the posts 31 against the tabs 222 inward, thereby securing the chip module 6 in a space defined by the latching member 221, the tabs 222, and the pivot portion 21.

Figure 5A:
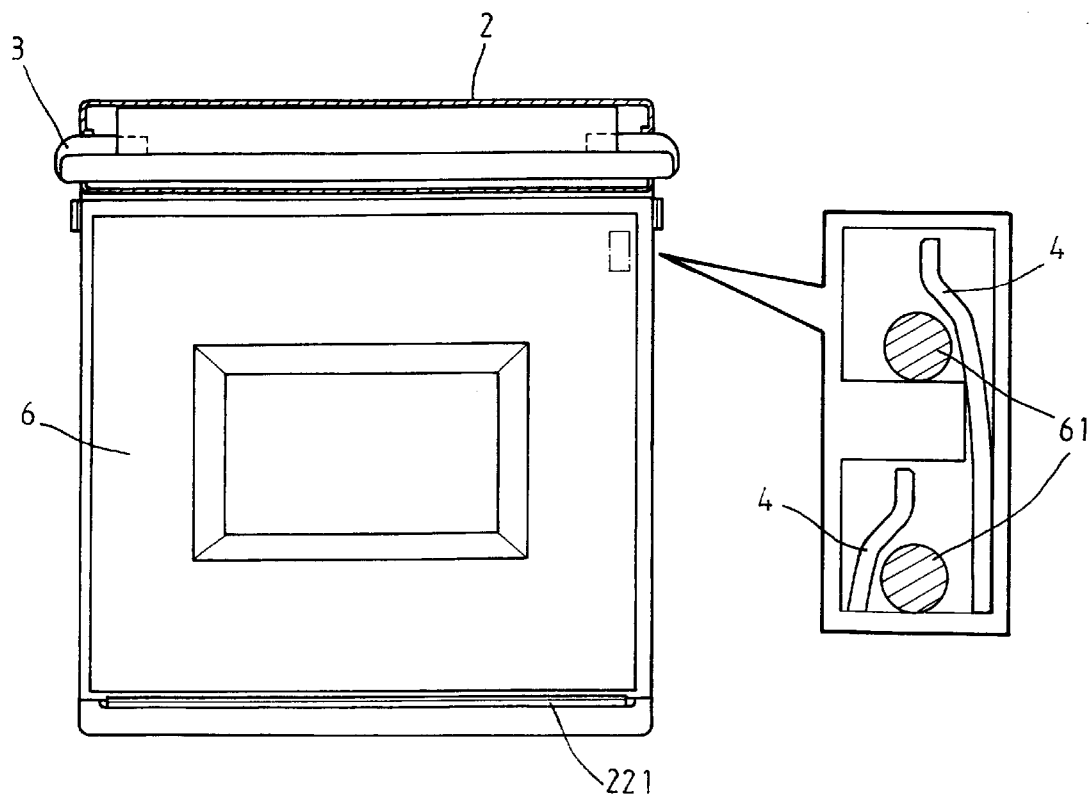
FIG. 5A is a top view of FIG. 3 showing the pin hole, wherein the pins of the chip module are not in contact with the pins of the connector.
Figure 5B:
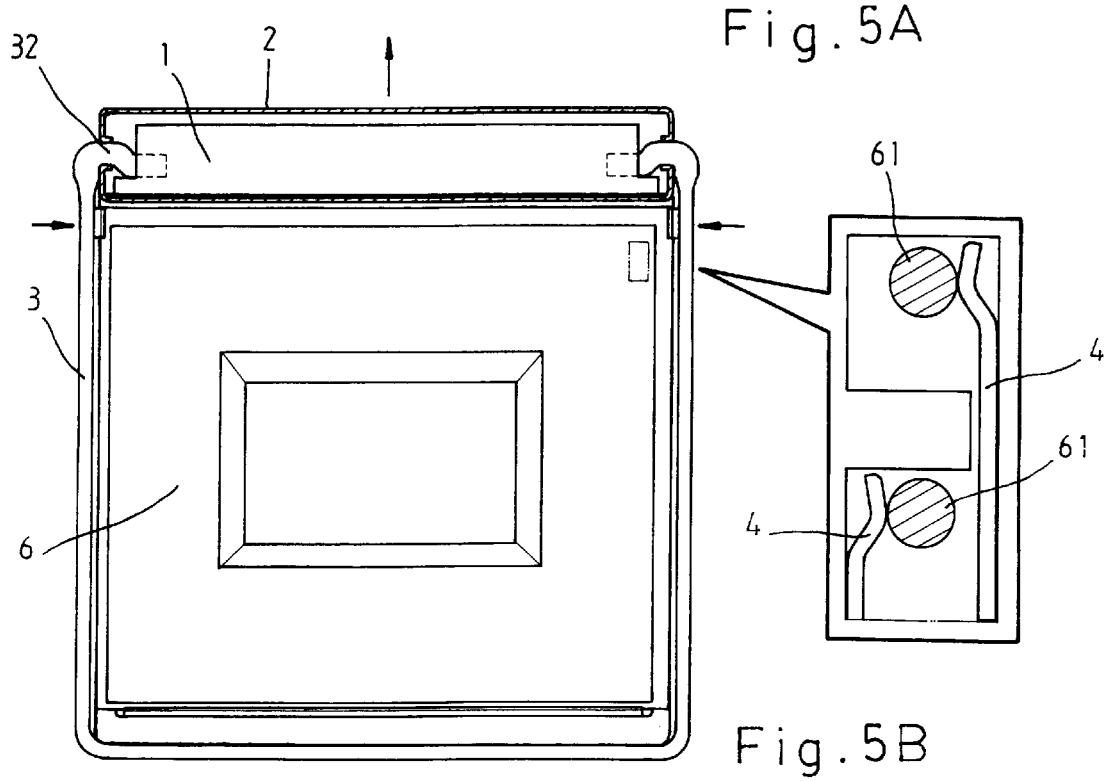
FIG. 5B is a top view of FIG. 4B showing the pin hole wherein the pins of the chip module are in contact with pins of connector.
Figures 6, 6A:
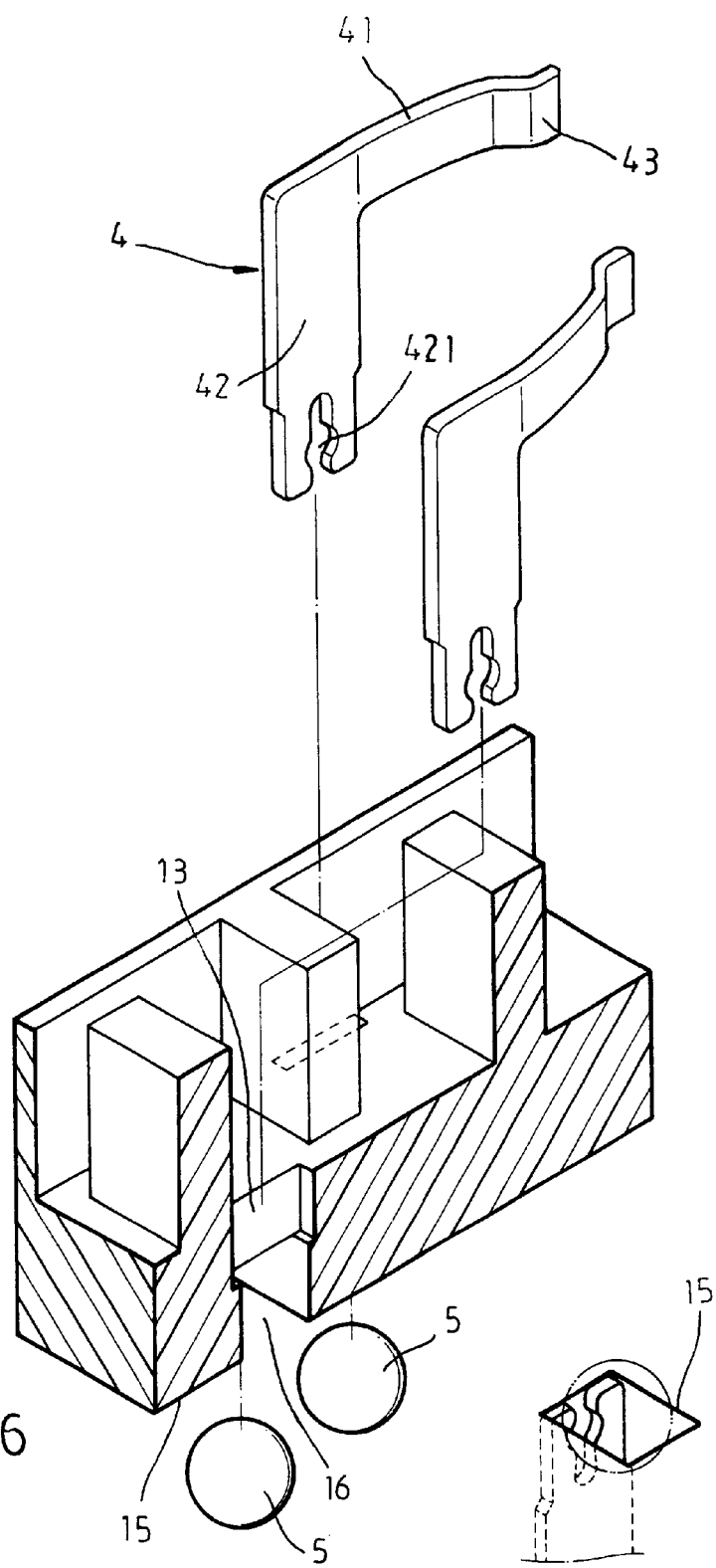
FIG. 6 is a sectional view of a partial pin hole.
FIG. 6A is a view schematically showing the engagement of the pin of the connector with a ball of the ball grid array.

Referring to FIGS. 5A, 5B, and 6, the pins 4 are overlapped in the pin holes 13. Each pin 4 has an inverted L-shape received in the pin holes 13. Each pin 4 comprises an engagement portion 43 engaged with a pin 61 of the chip module 6 to form an electrical connection thereto, a rod 42 engaged with the mainboard, and a flexible portion 41 connected between the engagement portion 43 and the rod 42. As stated above, the pins 4 are overlapped in the pin holes 13 such that the flexible portion 41 of one pin 4 may extend to the adjacent pin 4 when the rods 42 of the pins 4 are secured in pin holes 13. It is provided that flexible portion 41 has a relatively longer length as compared to the conventional one, resulting in a sufficient elastic force. As a result, a good contact between the engagement portions 43 of the pins 4 of the connector and the pins 61 of the chip module 6 is obtained, thereby enabling high quality data transmission ability between the mainboard and the chip module 6 (see FIGS. 5A and 5B).

Referring to FIGS. 6 and 6A, it is appreciated that the pin 4 of the connector of the invention may be secured to a mainboard by using ball grid array (BGA) technique. In detail, a ball hole 16 is provided under one pin hole 13 in the engagement surface 15 of the connector body 1. A rod 42 with a recess 421 extends to the ball hole 16. Note that the edge of the recess 421 has a special designed curved portion such that a ball 5 in the ball hole 16 may be secured to the rod 42 of the pin 4 when the rod 42 is engaged to the ball 5.

While the invention herein disclosed has been described by means of specific embodiments, numerous modifications and variations could be made thereto by those skilled in the art without departing from the scope and spirit of the invention set forth in the claims.

What is claimed is:

1. An electrical connector for connecting a chip module having chip module pins to a mainboard of a computer, the connector comprising:

a connector body having a top support surface, an bottom engagement surface for being engaged with the mainboard, a plurality of pin holes in the connector body, and a side base;

a plurality of connector pins received in the pin holes; each connector pin having an engagement portion engaged with the chip module pin of the chip module to form an electrical connection therebetween, a rod engaged with the mainboard, and a flexible portion connected between the engagement portion and the rod;

a sliding board with the chip module mounted thereon, the sliding board including a rectangular frame for being engaged with the support surface of the connector body and having two flexible tabs protuding upwardly on two opposing sides of the rectangular frame, and a pivot portion abutted to a side of the rectangular frame and positioned corresponding to the side base of the connector body; and a lock lever adjacent to the flexible tabs and including two posts, a bar connected between the posts, and two bending portions each extending inwardly from a respective one of the posts such that the bending portions are inserted through the pivot portion and the side base to secure the lock lever, the sliding board, and the connector body together;

wherein the tabs are bent for pressing the chip module on the sliding board when the lock lever is pulled down to cause the posts to resist against the tabs, whereby the chip module is secured on the sliding board.

2. The electrical connector of claim 1, wherein the lock lever is an n shaped lever.

3. The electrical connector of claim 1, wherein the frame of the sliding board further comprises a side latching member opposed to the pivot portion of the sliding board.

4. The electrical connector of claim 1, wherein the frame of the sliding board further comprises two spaced openings each being located on the same side as each of the tabs and the connector body further comprises two projections slightly smaller than the openings; the protrusions being inserted into the openings to thereby fasten the sliding board on the connector body, while allowing the sliding board to move horizontally with respect to the connector body through a predetermined distance.

5. The electrical connector of claim 1, wherein the connector pins of the connector overlap in the pin holes.

6. The electrical connector of claim 5, wherein each of the connector pins of the connector has an inverted L-shape; whereby, the flexible portion of one connector pin of the connector extends to the adjacent connector pin of the connector when the rods of the connector pins of the connector are secured in the pin holes.

7. The electrical connector of claim 1, further comprising a ball hole provided under each pin hole in the engagement surface of the connector body and a ball, wherein the rod of the connector pin of the connector has a recess extending to the ball hole for securing the ball.

8. The electrical connector of claim 7, wherein the recess of the connector pin of the connector has a predetermined inner surface.

* * * * *